United States Patent
Schoenecker et al.

(10) Patent No.: US 8,733,425 B2
(45) Date of Patent: May 27, 2014

(54) APPARATUS AND METHOD FOR THE PRODUCTION OF SEMICONDUCTOR MATERIAL FOILS

(75) Inventors: Axel Georg Schoenecker, Alkmaar (NL); Eric De Jager, Broek op Langedijk (NL); Eelko Gelbert Hoek, Santpoort Noord (NL); Pierre-Yves Pichon, Alkmaar (NL)

(73) Assignee: RGS Development B.V. Petten (NL)

( * ) Notice: Subject to any disclaimer, the term of this patent is extended or adjusted under 35 U.S.C. 154(b) by 0 days.

(21) Appl. No.: 13/577,370

(22) PCT Filed: Feb. 8, 2011

(86) PCT No.: PCT/NL2011/050087
§ 371 (c)(1),
(2), (4) Date: Oct. 1, 2012

(87) PCT Pub. No.: WO2011/096815
PCT Pub. Date: Aug. 11, 2011

(65) Prior Publication Data
US 2013/0017409 A1    Jan. 17, 2013

(30) Foreign Application Priority Data
Feb. 8, 2010   (NL) .................................. 2004209

(51) Int. Cl.
B22D 11/00   (2006.01)
B22D 11/06   (2006.01)

(52) U.S. Cl.
USPC ............ 164/463; 164/423; 164/475; 164/415

(58) Field of Classification Search
USPC .................. 164/462, 463, 475, 415, 423, 429
See application file for complete search history.

(56) References Cited

U.S. PATENT DOCUMENTS

| | | | | |
|---|---|---|---|---|
| 4,791,979 A | * | 12/1988 | Liebermann | 164/463 |
| 4,972,900 A | * | 11/1990 | Szczypiorski | 164/481 |
| 2009/0014840 A1 | * | 1/2009 | Schonecker | 257/618 |

FOREIGN PATENT DOCUMENTS

| | | | |
|---|---|---|---|
| DE | 10047929 A1 | 4/2002 | |
| WO | WO 2005/104244 A1 | 11/2005 | |
| WO | WO 2005/122287 A1 | 12/2005 | |

OTHER PUBLICATIONS

English language abstract and machine-assisted English translation for DE 10047929 extracted from the espacenet.com database on Dec. 19, 2012, 42 pages.

International Search Report for Application No. PCT/NL2011/050087 dated Mar. 18, 2011, 4 pages.

(Continued)

Primary Examiner — Kevin P Kerns
(74) Attorney, Agent, or Firm — Warner Norcross & Judd LLP

(57) ABSTRACT

A casting device for producing semiconductor material foil includes a casting frame and a substrate band. The casting frame is arranged for holding a molten semiconductor material and includes sidewalls of which an exit sidewall is located at an output position for the semiconductor material foil. The exit side wall is provided with an exit slit. The casting device further includes a local force exerting means to exert at the location of the exit slit a locally enlarged external force on the molten semiconductor material to enlarge an outer pressure on the molten material at the exit slit.

15 Claims, 3 Drawing Sheets

(56) References Cited

OTHER PUBLICATIONS

H. Lange et al., "Ribbon Growth on Substrate (RGS)—A New Approach to High Speed Growth of Silicon Ribbons or Photovoltaics," Journal of Crystal Growth 104 (1990) 108-112.

Koch et al., "Preparation, Characterisation, and Cell Processing of Bayer RGS Silicon Foils (Ribbon Growth on Substrate)," Oral presentation at 2nd World Conference & Exhibition on Photovoltaic Solar Energy Conversion, Vienna Austria, Jul. 6-10, 1998; 6 pages.

* cited by examiner

Fig 1 _Prior Art_
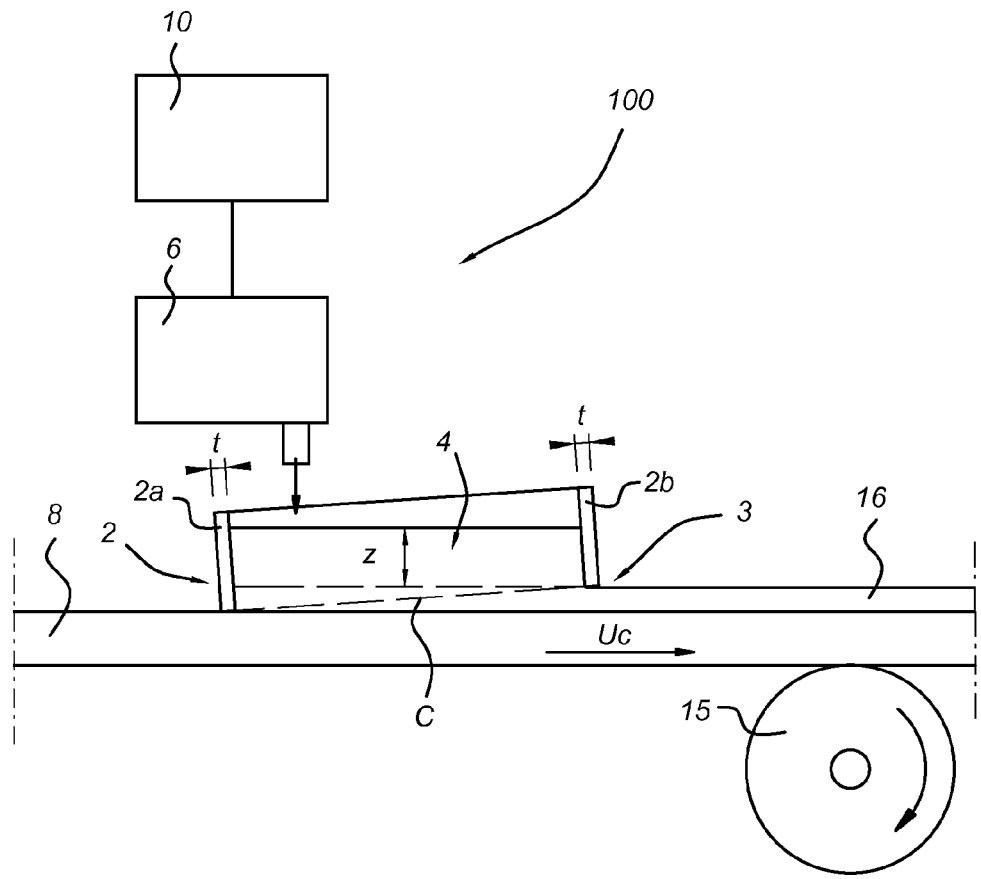
Fig 2
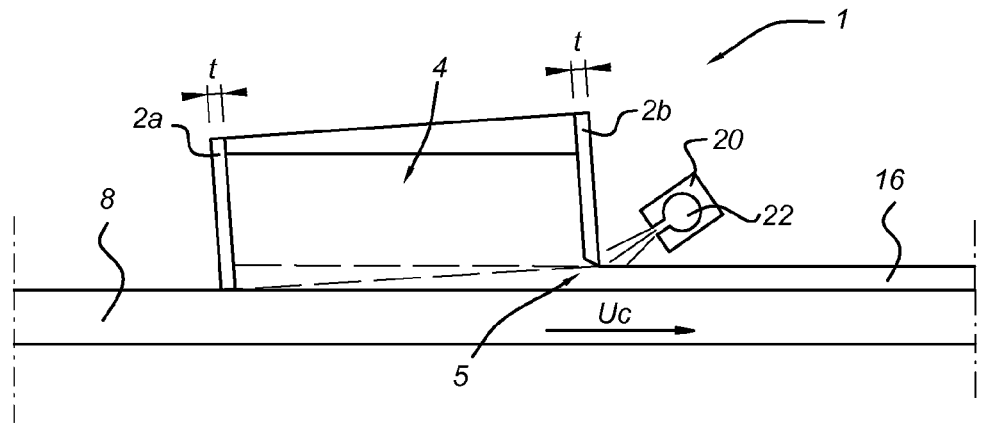

APPARATUS AND METHOD FOR THE PRODUCTION OF SEMICONDUCTOR MATERIAL FOILS

RELATED APPLICATIONS

This application is the National Stage of International Patent Application No. PCT/NL2011/050087, filed on Feb. 8, 2011, which claims priority to Netherlands Patent Application No. NL 2004209, filed on Feb. 8, 2010.

The invention relates to an apparatus for the production of crystalline semiconductor foils which is arranged for drawing a semiconductor material foil from a volume of molten fluid semiconductor. Additionally, the present invention relates to a method the production of semiconductor material foils.

Such an apparatus is for example known from international patent application WO 2005/122287, which discloses a casting device for the production of crystalline silicon foils.

The casting device consists of a casting frame into which fluid silicon can be poured. The fluid silicon is poured from a furnace into the casting frame with the aid of a feed device. Below the casting frame there is a substrate band that is set up to pass underneath the casting frame at a specific speed. Because the substrate band is moving, a silicon foil or sheet will be produced on a downstream side of the casting frame. The silicon foil can be cut into wafers which can be used for manufacturing photo-voltaic devices. The substrate band can exist of a plurality of (semi-) linked substrate plates, resulting in the production of separate wafers.

A disadvantage of the prior art casting device is that wafers manufactured in this manner often show a rough top-surface (i.e., a free-crystallizing surface). This rough surface results from the drag-out of a molten silicon film on top of the crystallized foil. During the casting process the silicon foil starts to grow at the moment (a portion of the substrate band comes in contact with the molten silicon. During its pass underneath the casting frame in contact with the molten silicon, the silicon wafer grows to its desired thickness. At the exit of the casting frame the molten silicon is held-back by the casting frame exit wall. As the casting frame exit wall can move in vertical direction to accommodate variations in foil thickness a small amount of molten silicon is extracted from the casting frame on top of the solid silicon foil. After leaving the casting frame, this liquid crystallizes during cooling down in a less controlled way, causing a rough wafer surface. In a subsequent step, the rough surface must be removed e.g., by polishing.

It is an object of the present invention to reduce or overcome the disadvantages of the prior art. The object is achieved according to the invention by a casting device for producing semiconductor material foil, comprising a casting frame and a substrate band, the casting frame being arranged for holding a molten semiconductor material and comprising sidewalk of which an exit sidewall is located at an output position for the semiconductor material foil, the exit side wall being provided with an exit slit, wherein the casting device further comprises a local force exerting means to exert at the location of the exit slit a local relatively enlarged external force on the molten semiconductor material to enlarge locally an outer pressure on the molten semiconductor material at the exit slit.

Advantageously, the present invention allows to reduce the drag-out of liquid molten semiconductor material, by providing locally a relatively enlarged external force to enlarge the local outer pressure at the exit slit in such a way that the outer pressure at the exit slit is relatively larger than a working pressure surrounding the casting frame, and as a consequence reduce the static pressure of the liquid semiconductor material in the casting frame. As a result, the outflow of the liquid semiconductor material at the exit slit is better controlled and the drag-out reduced. According to an aspect of the invention there is provided a casting device as described above, wherein the force exerting means comprises a gas jet generator for producing a gas jet with relatively high pressure compared to the ambient pressure at the location of the exit slit; the gas jet generator being arranged for directing the gas jet towards the exit slit.

According to an aspect of the invention there is provided a casting device as described above, wherein the gas jet generator comprises an inlet for pressurized gas, a duct and an outlet for producing the gas jet; the inlet being connected to the duct and the duct being connected to the outlet.

According to an aspect of the invention there is provided a casting device as described above, wherein the force exerting means comprises an overpressure device; the overpressure device being arranged at the exit sidewall of the casting device and is adapted for producing at the location of the exit slit an overpressure relative to the outer pressure.

According to an aspect of the invention there is provided a casting device as described above, wherein the overpressure device comprises an inlet for pressurized gas, a pressure leveling chamber, and an overpressure chamber; the inlet being connected with an entrance of the pressure leveling chamber, an exit of the pressure leveling chamber being in communication with the overpressure chamber, the overpressure chamber being located at the exit slit of the casting frame.

According to a further aspect there is provided a casting device as described above wherein the pressure leveling chamber extends along the width of the exit side wall and is adapted for leveling the pressure of the gas along the width of the exit side wall and the overpressure chamber extends substantially along the full width of the exit slit. According to a further aspect there is provided a casting device as described above, wherein the pressure leveling chamber is connected to the overpressure chamber over to the full width of the side wall so as to create a substantially constant pressure in the overpressure chamber over the full width of the exit slit. According to a further aspect there is provided a casting device as described above, wherein the overpressure device comprises a second pressure leveling chamber arranged in between the pressure leveling chamber and the overpressure chamber; the pressure leveling chamber being connected to the second pressure leveling chamber and the second pressure leveling chamber being connected to the overpressure chamber.

According to an aspect of the invention there is provided a casting device as described above, comprising a conductive coil as force exerting means, the conductive coil being located around the casting frame and being adapted for conducting an alternating electric current.

According to a further aspect there is provided a casting device as described above, wherein the conductive coil is adapted as force exerting means by inducing currents in the molten semiconductor material for causing an electromagnetic force in the molten semiconductor material.

According to a further aspect there is provided a casting device as described above, wherein the conductive coil and the casting frame are arranged for causing the electromagnetic force to produce an additional pressure at the location of the exit slit to enlarge the outer pressure. According to a further aspect there is provided a casting device as described above, wherein the conductive coil comprises one or more windings, the windings being oriented in an oblique manner, the windings at the side of the exit side wall being positioned at relative closer distance to the substrate band than the windings at the opposite side wall that are positioned at relative larger distance from the substrate band. According to an aspect of the invention there is provided a casting device as described above, wherein the alternating electric current is a high frequency current and has a frequency between about 2 kHz and about 50 kHz.

According to a further aspect there is provided a casting device as described above, wherein the conductive coil is additionally adapted for heating of molten semiconductor material by the inducted currents in the molten semiconductor material. According to an aspect of the invention there is provided a casting device as described above, wherein the casting device further comprises a secondary heating system for heating the semiconductor material.

According to an aspect of the invention there is provided a casting device as described above, wherein the secondary heating system is a system for radiative heating.

According to an aspect of the invention there is provided a casting device as described above, wherein the exit side wall at the exit slit comprises a knife edge end beveled on the inner side of the exit side wall.

According to an aspect of the invention there is provided a casting device as described above, comprising a flow restriction wall, the flow restriction wall being attached to the lower end of the exit side wall proximate to the substrate band; the flow restriction wall being adapted to extend the length of the exit side wall in the moving direction of the substrate band.

According to an aspect of the invention there is provided a method for casting semiconductor foil, comprising—pouring molten semiconductor material into a casting frame, the casting frame comprising sidewalls of which an exit sidewall is located at an output position for the semiconductor material foil, the exit side wall being arranged with an exit slit;— setting up a substrate band to pass underneath the casting frame at a specific speed for producing the semiconductor foil on a downstream side of the casting frame, further comprising: exerting at the location of the exit slit a locally relatively enlarged external force on the molten semiconductor material to enlarge an outer pressure on the molten semiconductor material at the exit slit.

According to an aspect of the invention there is provided a semiconductor material foil, produced by a method as described above.

According to an aspect of the invention there is provided a semiconductor material foil produced by a method and a casting device as described above.

Advantageous embodiments are further defined by the dependent claims.

Below, the invention will be explained with reference to some drawings, which are intended for illustration purposes only and not to limit the scope of protection as defined in the accompanying claims.

BRIEF DESCRIPTION OF DRAWINGS

FIG. 1 shows a cross-section of a casting device from the prior art;

FIG. 2 shows a cross-section of a casting device according to a first embodiment of the present invention;

DESCRIPTION OF EMBODIMENTS

Figure 3:
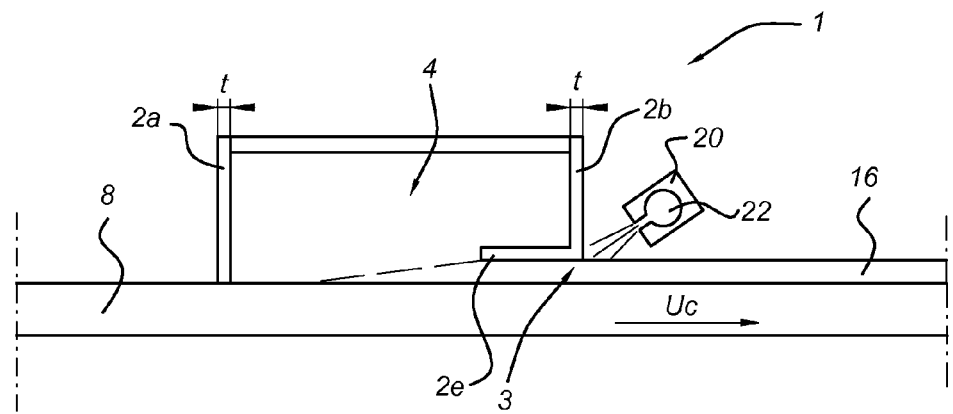
FIG. 3 shows a cross-section of a casting device according to a second embodiment of the present invention.

FIG. 1 shows a cross-section of a casting device from the prior art.

The casting device 100 comprises a casting frame 2, typically a rectangular frame, into which fluid silicon can be poured. The casting frame 2 is typically a rectangular frame and comprises four sidewalls with a thickness t. The fluid semiconductor material 4 is poured from a furnace 10 holding the molten semiconductor material into the casting frame 2 with the aid of a feed device 6. Below the casting frame 2 there is a substrate band 8 that is set up to pass underneath the casting frame 2 at a specific casting speed $U_C$. The drive installation 15 required for this is schematically indicated.

The temperature of the substrate band 8 is set such that the molten semiconductor material 4 crystallizes at the surface with the substrate band 8. Because the substrate band 8 is moving, to the right in FIG. 1, a foil 16 will be produced on a downstream side of the casting frame 2 at an exit slit 3. The contour of the solidifying foil on the substrate band under the molten semiconductor material is indicated by dashed line C. The solidified foil 16 pushes the casting frame 2 slightly upwards on the downstream side, as a result of which the casting frame tilts slightly and an exit slit is created. A semiconductor material foil is drawn in this way. The method described here may be referred to as RGS (Ribbon Growth on Substrate). A major advantage of RGS technology is that a relatively large amount of foil can be produced per hour.

A disadvantage of the prior art casting device is that wafers manufactured in this to manner often show a rough top-surface (i.e., a free-crystallizing surface). This rough surface results from the drag-out of a molten semiconductor material film on top of the crystallized foil. During the casting process the semiconductor material foil starts to grow at the moment (a portion of) the substrate band comes in contact with the liquid semiconductor material. During its pass underneath the casting frame in contact with the molten semiconductor material, the semiconductor material wafer grows to its desired thickness. At the exit slit 3 of the casting frame the molten semiconductor material is held-back by the casting frame exit sidewall 2b.

The drag-out of the casting device can be described by the following equation:

$$\Phi = \langle U \rangle H = \frac{1}{2} U_C H - \frac{1}{12\eta} \frac{\Delta P}{\Delta x} H^3,$$

where $\Phi$ is the flux of semiconductor material from the casting frame, $\langle U \rangle$ is the observed velocity of the liquid, $U_C$ is the casting speed, H is the height of the slit, $\eta$ is the viscosity of the liquid, $\Delta P$ is the static pressure of the liquid, and $\Delta x$ is length of the exit wall in the moving direction of the substrate band.

Within the casting frame the molten semiconductor material is at a level z above the top surface of the foil. The static pressure $\Delta P$ is equal to the pressure difference between the column of liquid silicon (with height z) and the outer pressure at the exit of the casting frame.

To reduce the drag-out, the present invention recognizes a reduction of the static pressure term $\Delta P$ by providing a casting device comprising a force exerting means to exert an external force to enlarge the outer pressure.

To this end, the present invention provides a casting device for producing semiconductor material foil, that comprises a casting frame and a substrate band, the casting frame being arranged for holding a molten semiconductor material and comprising sidewalk of which an exit sidewall is located at an output position for the semiconductor material foil, the exit side wail being provided with an exit slit, wherein the casting device further comprises a force exerting means to exert at the location of the exit slit an external force on the molten semiconductor material to enlarge an outer pressure on the molten semiconductor material.

In an embodiment, the force exerting means are arranged as local force exerting means capable of generating at the location of the exit slit a local relatively enlarged external force on the molten semiconductor material so as to enlarge the outer pressure on the molten semiconductor material locally at the exit slit.

FIG. 2 shows a cross-section of a casting device according to a first embodiment of the present invention.

In this cross-section in the same direction as shown in FIG. 1, the casting device 1 according to the first embodiment, comprises a gas jet generator 20 as force exerting means. Such a gas jet generator comprises an inlet for pressurized gas, a duct and an outlet 22 for producing a gas jet with relatively high pressure compared to outer or ambient pressure. The gas jet generator is arranged for generating and directing the gas jet towards the exit slit.

It will be appreciated that outer or ambient pressure, i.e., the pressure outside of the casting frame, relates to the static pressure of the work space in which the casting frame is located. The typical process pressure, the pressure in the casting frame (process chamber) above the molten semiconductor material, is less than atmospheric pressure. In a non-limiting example, the pressure in the casting frame is chosen between 0.1 and 0.9 bar (absolute pressure) and the pressure of the gas jet is chosen between about 2 and about 4 bar (absolute pressure).

Within the gas jet generator, the inlet is connected to the duct and the duct is connected to the outlet.

The outlet 22 of the gas jet generator is shaped in such a way so as to produce a gas jet that substantially extends along the width of the exit slit 3 of the casting frame. In this manner the gas jet is adapted to exert an external pressure along substantially the full width of the exit slit. The outlet of the gas jet generator 20 is arranged at the exit sidewall 2h of the casting device 2 and is adapted for producing a gas jet directed towards the exit slit 3.

The pressure exerted by the gas jet, provides that molten semiconductor material that is dragged with the foil from the semiconductor material bath in the casting; frame is held back.

Additionally, the exit side wall 2b of the casting frame can be shaped to optimize the effect of the gas jet and can comprise a knife edge end beveled on the inner side of the side wall 2b.

It is observed that the gas jet in combination with the knife edge end on the exit side 2b, improves reduction of the drag-out even further. As a result, the roughness of the cast semiconductor material foil is reduced.

The gas jet may comprise a gas species which does not react with the semiconductor material. For example, the gas stream may comprise a noble gas like Argon or an inert gas like Nitrogen.

FIG. 3 shows a cross-section of a casting device according to a second embodiment of the present invention.

In FIG. 3 an alternative embodiment is shown in which the exit side wall 2b of the casting frame comprises a flow restriction wall 2e. The flow restriction wall 2e is attached to the lower end of the exit side wall proximate to the substrate band 8. The flow restriction wall 2e is substantially parallel to the substrate band and is adapted to extend the length Δx of the exit wall in the moving direction of the substrate band 8. The flow restriction wall is arranged relatively close to the substrate band so as to form a narrow channel towards the exit slit. Due to the small dimension of the channel the flow of molten material during the casting process is reduced in comparison to the speed $U_C$ of the substrate band. Advantageously, the reduction of the flow creates an underpressure which reduces the static pressure ΔP at the exit slit.

Moreover, the gas jet in combination with the flow restriction wall 2e end on the exit side wall 2b is observed to improve a reduction of the drag-out.

Figure 4:
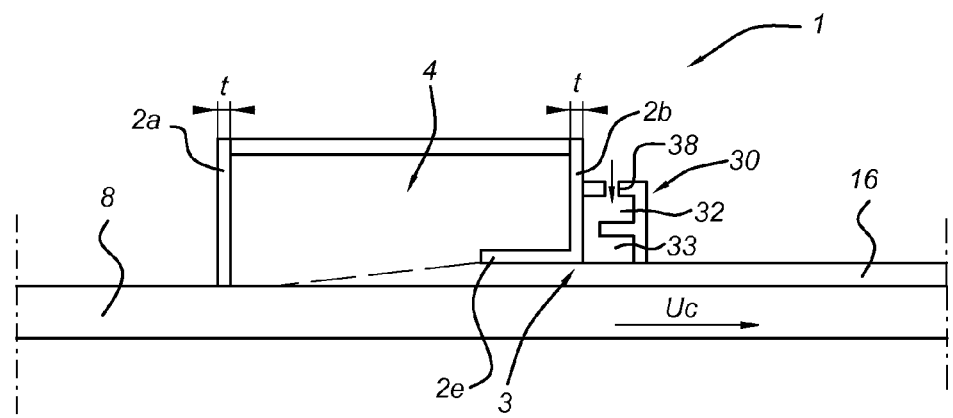
FIG. 4 shows a cross-section of a casting device according to a third embodiment of the present invention.

FIG. 4 shows a cross-section of a casting device according to a third embodiment of the present invention.

In this cross-section in the same direction as shown in FIG. 1, the casting device 1 according to the third embodiment, comprises an overpressure device 30 as force exerting means and a flow restriction wall 2e.

The overpressure device 30 is arranged at the exit sidewall 2b of the casting device 2 and is adapted for producing at the location of the exit slit an overpressure relative to the outer pressure. The overpressure device 30 comprises an inlet 38 for pressurized gas, a pressure leveling chamber 32, and an overpressure chamber 33. Within the overpressure device, the inlet is connected with an entrance of the pressure leveling chamber. An exit of the pressure leveling chamber is in communication with the overpressure chamber. The overpressure chamber 33 is located at the exit slit of the casting frame.

The pressure leveling chamber extends along the width of the exit side wall 2b and is to adapted for leveling the pressure of the gas along the width of the exit side wall 2b. Similarly, the overpressure chamber extends substantially along the full width of the exit slit. Preferably, the pressure leveling chamber is in communication with the overpressure chamber over the full width of the side wall so as to create a substantially constant pressure in the overpressure chamber over the full width of the exit slit. Further, the flow restriction wall 2e is attached to the lower end of the exit side wall proximate to the substrate band 8. The flow restriction wall 2e is adapted to extend the length Δx of the exit wall in the moving direction of the substrate band 8. The pressurized gas may comprise a gas species which does not react with the semiconductor material. For example, the gas stream may comprise a noble gas like Argon or an inert gas like Nitrogen.

Figure 5:
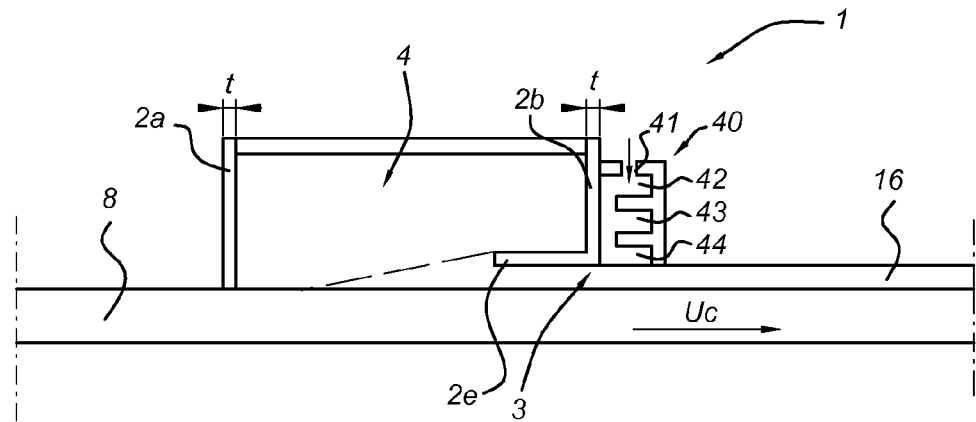
FIG. 5 shows a cross-section of a casting device according to an alternative embodiment of the present invention.

FIG. 5 shows a cross-section of a casting device according to an alternative embodiment of the present invention.

In this alternative of the third embodiment, the overpressure device 40 comprises the inlet 41 for pressurized gas, a first pressure leveling chamber 42, a second pressure leveling chamber 43 and the overpressure chamber 44.

Within the overpressure device, the inlet is connected with an entrance of the first pressure leveling chamber. The first pressure leveling chamber is connected to the second pressure leveling chamber. The second pressure leveling chamber is connected with the overpressure chamber. The overpressure chamber is located at the exit slit of the casting frame.

The first pressure leveling chamber extends along the width of the exit side wall 2b and is adapted for leveling the pressure of the gas along the width of the exit side wall 2b. Similarly, the second pressure leveling chamber extends substantially along the full width of the exit slit.

Preferably, the first pressure leveling chamber is connected to the second pressure leveling chamber over the full width of the exit side wall.

Figure 6:
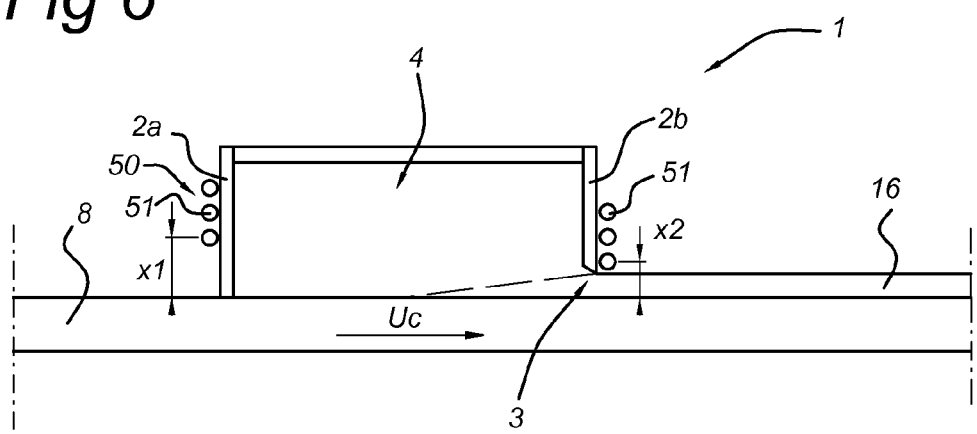
FIG. 6 shows a cross-section of a casting device according to a fourth embodiment of the present invention.

FIG. 6 shows a cross-section of a casting device according to a fourth embodiment of the present invention.

In this cross-section in the same direction as shown in FIG. 1, the casting device 1 according to the fourth embodiment comprises a conductive coil 50 located around the casting device and is adapted for conducting a high frequency alternating electric current. The conductive coil 50 comprises one or more windings 51 wound around the circumference of the casting device.

The conductive coil 50 is adapted as a force exerting means by inducing currents in the molten semiconductor material which cause an electro magnetic force (Lorentz force) in the molten semiconductor material.

The shape and the thickness of the casting frame wall 2b are designed in a way that the induced electromagnetic currents in the casting frame only partially compensate the alternating magnetic field generated in the conductive coil; the part that is not compensated induces electrical currents in the molten semiconductor material resulting in an electromagnetic force acting on the molten semiconductor material.

The arrangement of the conductive coil and the casting frame is adapted in such a way that at the location of the exit slit the electromagnetic force produces a locally enlarged outer pressure that reduces the static pressure ΔP.

The electromagnetic force can be controlled by the geometry of the coil 51 and of the casting frame 2 in combination with the electrical parameters such as current and frequency.

At the same time, the induced currents in the conductive casting frame and the molten semiconductor material cause heating of the frame and the molten semiconductor material. Advantageously, this allows a better control of the temperature of the molten semiconductor material in the casting frame.

In a further embodiment, the casting device comprises a secondary heating system for additional heating. The secondary heating system is based on heating other than by induced currents, for example by radiative heating.

In FIG. 6 the windings 51 are oriented in an oblique manner. The windings at the side of the exit side wall 2b are positioned at relative closer distance to the substrate band 8 than the windings at the opposite side wall 2a that are positioned at relative larger distance from the substrate band 8. By the oblique arrangement of the windings the electromagnetic force exerted on the molten semiconductor material at the location of the exit slit is relatively larger than the electromagnetic force exerted on the molten semiconductor material 4 inside the casting frame. As a result, the nett static pressure ΔP at the exit slit is compensated by a pressure originating from the electromagnetic force.

The distance x1 of the windings at the side of the exit side wall 2b to the substrate hand 81s for example at least 5% smaller than the distance x2 at the side of the opposite side wall 2a to the substrate band 8.

The skilled person will appreciate that an asymmetric arrangement of the coil in relation to the position of the casting frame may generate a varying electromagnetic force as a function of the location around the casting frame.

Figure 7:
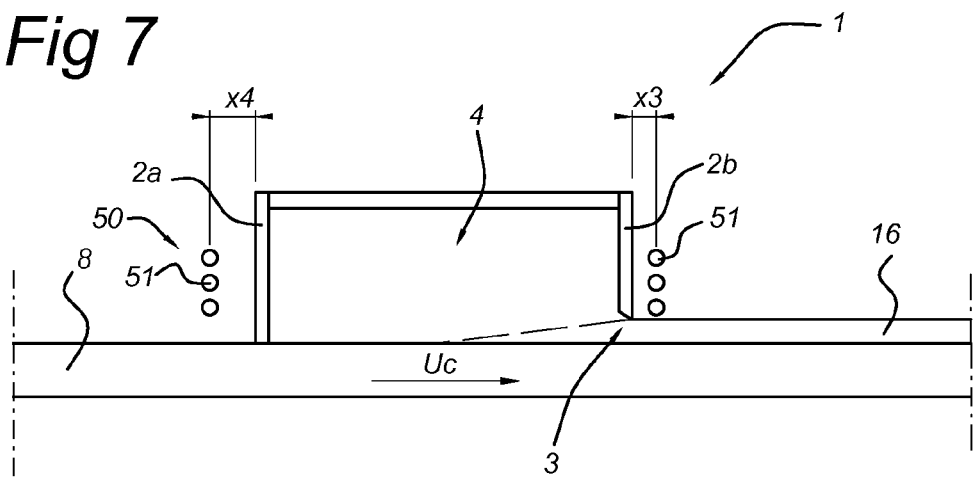
FIG. 7 shows a cross-section of a casting device according to an alternative fifth embodiment of the present invention.

FIG. 7 shows a cross-section of a casting device according to an alternative fifth embodiment of the present invention.

In the fifth embodiment, the locally enlarged outer pressure at the exit slit is achieved by a horizontal asymmetrical arrangement of the coil relative to the casting frame which is surrounded by the coil. In this embodiment, the windings at the side of the exit side wall 2b are positioned at relative closer horizontal distance along the substrate band 8 to the exit side watt 2b than the windings at the opposite side wall 2a that are positioned at relative larger horizontal distance from the opposite side wall 2a. In the vertical direction, the windings at the exit side wall 2b and the opposite side wall 2a may be at a same vertical level relative to the substrate band 8 or the windings at the side of the exit side wall 2b are positioned at relative closer distance to the substrate band 8 than the windings at the opposite side wall 2a that are positioned at relative larger distance from the substrate band 8.

The distance x3 of the windings to the side of the exit side wall 12b is for example at least 5% smaller than the distance x4 of the windings to the side of the opposite side wall 2a. Optionally, the casting device comprises a knife edge end 5 beveled on the inner side of the side wall 2h. The knife edge end on the exit side wall 2b provides a higher transparency for the electromagnetic force and thus a reduced shielding of the molten semiconductor material at the exit slit. The knife edge end 5 allows a locally enhanced coupling between the electromagnetic force and the liquid silicon with a relatively higher electromagnetic force value.

Alternatively, the cast frame according to the fourth embodiment may comprise a flow restriction wall 2e which is attached to the lower end of the exit side wall proximate to the substrate band 8. The flow restriction wall 2e is adapted to extend the length Δx of the exit watt in the moving direction of the substrate band 8. The thickness of the flow restriction watt is adapted to allow induction of electrical currents in the molten semiconductor material resulting in an electromagnetic force acting on the melt. It is noted that in the prior art the casting frame is arranged for tilting of the exit side wall, the exit slit is created by a slight tilt of the casting frame caused by the solidified foil being cast. In the embodiments described here, the casting frame may be arranged for tilting to enable the temporary creation of an exit slit during casting by the tilt of the casting frame during the casting process or the casting frame is arranged with a permanent exit slit that may be tooled into the exit side wall.

Other alternatives and equivalent embodiments of the present invention are conceivable within the idea of the invention, as will be clear to the person skilled in the art. The idea of the invention is limited only by the appended claims.

The invention claimed is:

1. A casting device for producing semiconductor material foil, said casting device comprising a casting frame and a substrate band, the casting frame being arranged for holding a molten semiconductor material and comprising sidewalls of which an exit sidewall is located at an output position for the semiconductor material foil, the exit side wall being provided with an exit slit, wherein the casting device further comprises a local force exerting means to exert at the location of the exit slit a local relatively enlarged external force on the molten semiconductor material to enlarge locally an outer pressure on the molten semiconductor material at the exit slit as compared to a working pressure surrounding the casting frame, thereby reducing drag-out of the molten semiconductor material;

wherein the force exerting means comprises an overpressure device; the overpressure device being arranged at the exit sidewall of the casting device and is adapted for producing at the location of the exit slit an overpressure relative to the outer pressure; and wherein the overpressure device comprises an inlet for pressurized gas, a pressure leveling chamber, and an overpressure chamber; the inlet being connected with an entrance of the pressure leveling chamber, an exit of the pressure leveling chamber being in communication with the overpressure chamber, the overpressure chamber being located at the exit slit of the casting frame.

2. The casting device according to claim 1, wherein the pressure leveling chamber extends along the width of the exit side wall and is adapted for leveling the pressure of the gas along the width of the exit side wall and the overpressure chamber extends substantially along the full width of the exit slit.

3. The casting device according to claim 2, wherein the pressure leveling chamber is connected to the overpressure chamber over the full width of the side wall so as to create a substantially constant pressure in the overpressure chamber over the full width of the exit slit.

4. The casting device according to claim 1, wherein the overpressure device comprises a second pressure leveling chamber arranged in between the pressure leveling chamber and the overpressure chamber; the pressure leveling chamber being connected to the second pressure leveling chamber and the second pressure leveling chamber being connected to the overpressure chamber.

5. The casting device according to claim 1, wherein the exit side wall at the exit slit comprises a knife edge end beveled on the inner side of the side wall.

6. A casting device for producing semiconductor material foil, said casting device comprising a casting frame and a substrate band, the casting frame being arranged for holding a molten semiconductor material and comprising sidewalls of which an exit sidewall is located at an output position for the semiconductor material foil, the exit side wall being provided with an exit slit, wherein the casting device further comprises a local force exerting means to exert at the location of the exit slit a local relatively enlarged external force on the molten semiconductor material to enlarge locally an outer pressure on the molten semiconductor material at the exit slit as compared to a working pressure surrounding the casting frame, thereby reducing drag-out of the molten semiconductor material;
wherein the force exerting means comprises a conductive coil, the conductive coil being located asymmetrically around the casting frame and being adapted for conducting an alternating electric current, wherein the conductive coil is adapted as force exerting means by inducing currents in the molten semiconductor material for causing an electromagnetic force in the molten semiconductor material; and
wherein the molten semiconductor material is held back by the exit sidewall and the force exerting means.

7. The casting device according to claim 6, wherein the conductive coil and the casting frame are arranged for causing the electromagnetic force to produce an additional pressure at the location of the exit slit to enlarge the outer pressure.

8. The casting device according to claim 7, wherein the conductive coil comprises one or more windings, the windings being oriented in an oblique manner, the windings at the side of the exit side wall being positioned at relative closer distance to the substrate band than the windings at the opposite side wall that are positioned at relative larger distance from the substrate band.

9. The casting device according to claim 7, wherein the conducting coil comprises one or more windings, wherein the windings at the side of the exit side wall are positioned at relative closer horizontal distance along the substrate band to the exit side wall than the windings at the opposite side wall that are positioned at relative larger horizontal distance from the opposite side wall.

10. The casting device according to claim 6, wherein the alternating electric current is a high frequency current and has a frequency between about 2 kHz and about 50 kHz.

11. The casting device according to claim 6 wherein the conductive coil is additionally adapted for heating of molten semiconductor material by the inducted currents in the semiconductor material.

12. The casting device according to claim 11, wherein the casting device further comprises a secondary heating system for heating the molten semiconductor material.

13. The casting device according to claim 12, wherein the secondary heating system is a system for radiative heating.

14. A casting device for producing semiconductor material foil, said casting device comprising a casting frame and a substrate band, the casting frame being arranged for holding a molten semiconductor material and comprising sidewalls of which an exit sidewall is located at an output position for the semiconductor material foil, the exit side wall being provided with an exit slit, wherein the casting device further comprises a local force exerting means to exert at the location of the exit slit a local relatively enlarged external force on the molten semiconductor material to enlarge locally an outer pressure on the molten semiconductor material at the exit slit as compared to a working pressure surrounding the casting frame, thereby reducing drag-out of the molten semiconductor material;
the casting device further comprising a flow restriction wall, the flow restriction wall being attached to the lower end of the exit side wall proximate to the substrate band; the flow restriction wall being adapted to extend the length of the exit side wall in the moving direction of the substrate band.

15. A method for casting semiconductor foil, said method comprising:
pouring molten semiconductor material into a casting frame, the casting frame comprising sidewalls of which an exit sidewall is located at an output position for the semiconductor material foil, the exit side wall being arranged with an exit slit;
setting up a substrate band to pass underneath the casting frame at a specific speed for producing the semiconductor foil on a downstream side of the casting frame;
exerting at the location of the exit slit a locally relatively enlarged external force on the molten semiconductor material to enlarge an outer pressure on the molten semiconductor material at the exit slit as compared to a working pressure surrounding the casting frame, thereby reducing drag-out of the molten semiconductor material;
wherein the molten semiconductor material is held back by the exit sidewall and the force exerting means.

* * * * *